(12) United States Patent
Yama et al.

(10) Patent No.: US 9,698,281 B2
(45) Date of Patent: Jul. 4, 2017

(54) CMOS BOLOMETER

(71) Applicant: Robert Bosch GmbH, Stuttgart (DE)

(72) Inventors: Gary Yama, Mountain View, CA (US);
Ando Feyh, Palo Alto, CA (US);
Ashwin Samarao, Mountain View, CA (US); Fabian Purkl, Palo Alto, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 282 days.

(21) Appl. No.: 13/969,828

(22) Filed: Aug. 19, 2013

(65) Prior Publication Data
US 2014/0054740 A1 Feb. 27, 2014

Related U.S. Application Data

(60) Provisional application No. 61/691,837, filed on Aug. 22, 2012.

(51) Int. Cl.
*G01J 5/02* (2006.01)
*H01L 31/02* (2006.01)
(Continued)

(52) U.S. Cl.
CPC ........ *H01L 31/02019* (2013.01); *G01J 5/023* (2013.01); *G01J 5/024* (2013.01);
(Continued)

(58) Field of Classification Search
CPC .... G01J 2005/204; G01J 5/024; G01J 5/0809; G01J 5/023; G01J 5/0235; G01J 5/085; H01L 27/1446; H01L 31/02019
(Continued)

(56) References Cited

U.S. PATENT DOCUMENTS 5,021,663 A 6/1991 Hornbeck
7,683,324 B2 3/2010 Vogt
(Continued)

FOREIGN PATENT DOCUMENTS

EP 1251099 A2 10/2002
WO 2008108784 A2 12/2008

OTHER PUBLICATIONS

Akin, T., "CMOS-based Thermal Sensors," Ch. 10, CMOS-MEMS, p. 479-512, Feb. 29, 2008.
(Continued)

*Primary Examiner* — Matthew Landau
*Assistant Examiner* — Mark Hatzilambrou
(74) *Attorney, Agent, or Firm* — Maginot Moore & Beck LLP

(57) ABSTRACT

A method of manufacturing a semiconductor device includes forming at least one sacrificial layer on a substrate during a complementary metal-oxide-semiconductor (CMOS) process. An absorber layer is deposited on top of the at least one sacrificial layer. A portion of the at least one sacrificial layer beneath the absorber layer is removed to form a gap over which a portion of the absorber layer is suspended. The sacrificial layer can be an oxide of the CMOS process with the oxide being removed to form the gap using a selective hydrofluoric acid vapor dry etch release process. The sacrificial layer can also be a polymer layer with the polymer layer being removed to form the gap using an $O_2$ plasma etching process.

9 Claims, 8 Drawing Sheets

(51) Int. Cl.
   *G01J 5/20*      (2006.01)
   *H01L 27/144*    (2006.01)
(52) U.S. Cl.
   CPC ............... *G01J 5/0235* (2013.01); *G01J 5/20* (2013.01); *H01L 27/1446* (2013.01); *G01J 2005/204* (2013.01)
(58) Field of Classification Search
   USPC ................................ 257/428, 436, 444, 459
   See application file for complete search history.

(56) References Cited

U.S. PATENT DOCUMENTS

| | | |
|---|---|---|
| 8,080,797 B2 | 12/2011 | Vogt et al. |
| 9,064,982 B2 * | 6/2015 | Purkl ...................... G01J 5/045 |
| 2007/0115553 A1 * | 5/2007 | Chang-Hasnain ... G02B 5/0816 |
| | | 359/572 |
| 2007/0170363 A1 * | 7/2007 | Schimert ................... G01J 5/02 |
| | | 250/353 |
| 2008/0035846 A1 * | 2/2008 | Talghader ................. G01J 3/26 |
| | | 250/338.1 |
| 2010/0171190 A1 | 7/2010 | Liger |
| 2011/0062494 A1 * | 3/2011 | Engelmann ......... H01L 21/3065 |
| | | 257/192 |
| 2012/0161003 A1 | 6/2012 | Tsuchiya |

OTHER PUBLICATIONS

International Search Report and Written Opinion corresponding to PCT Application No. PCT/US2013/055752, mailed Nov. 26, 2013 (14 pages).

* cited by examiner

CMOS BOLOMETER

CROSS-REFERENCE TO RELATED APPLICATIONS

This application claims priority to U.S. Provisional Application Ser. No. 61/691,837 entitled "CMOS BOLOMETER" by Yama et al., filed Aug. 22, 2012, the disclosure of which is hereby incorporated herein by reference in its entirety.

TECHNICAL FIELD

This disclosure relates generally to infrared radiation sensors, and in particular to bolometer infrared radiation sensors.

BACKGROUND

In general, infrared radiation (IR) sensors are used in a variety of applications to detect infrared radiation and provide an electrical output that is a measure of the incident infrared radiation. IR sensors typically use either photonic detectors or thermal detectors for detecting the infrared radiation. Photon detectors detect incident photons by using the energy of the photons to excite charge carriers in a material. The excitation of the material is then detected electronically. Thermal detectors also detect photons. Thermal detectors, however, use the energy of said photons to increase the temperature of a component. By measuring the change in temperature, the intensity of the photons producing the change in temperature can be determined.

Photonic detectors typically have higher sensitivity and faster response times than thermal detectors. However, photon detectors must be cryogenically cooled in order to minimize thermal interference, thus increasing the cost, complexity, weight, and power consumption of the device. In contrast, thermal detectors operate at room temperature, thus avoiding the cooling required by photon detector devices. As a result, thermal detector devices can typically have smaller sizes, lower costs, and lower power consumption than photon detector devices.

One type of infrared thermal detector is a thermopile. A thermopile is formed of several thermocouples connected in series. Each thermocouple consists of two conductors of dissimilar materials that produce a voltage in the vicinity of a junction of the conductors that is dependent on the temperature difference between the junction and the other parts of the conductors. The thermocouples are connected in series with the "hot junctions" positioned nearest to the IR absorbing area of the detector and the "cold junctions" positioned farthest away from the IR absorbing area. To attain reasonable sensitivity in the thermopile-based IR detector, the hot and cold junctions of the thermopile need to be as thermally isolated as possible from each other and from other heat sources that can influence the temperatures of the hot and cold junctions. To achieve this thermal isolation, the thermopile is often placed on top of a dielectric layer on a substrate and a large back cavity is etched into the substrate beneath the thermopile to increase thermal resistance.

Another type of infrared thermal detector is a bolometer. A bolometer includes an absorber element for absorbing infrared radiation and a transducer element in thermal contact with the absorber element that has an electrical resistance that varies with temperature. In operation, infrared radiation incident upon the bolometer will be absorbed by the absorber element of the bolometer and the heat generated by the absorbed radiation will be transferred to the transducer element. As the transducer element heats in response to the absorbed radiation, the electrical resistance of the transducer element will change in a predetermined manner. By detecting changes in the electrical resistance, a measure of the incident infrared radiation can be obtained. Bolometers may serve as individual sensors, but may also be designed as rows or 2D arrays, referred to as microbolometer arrays.

Recent advances in technology have enabled the absorber element of a bolometer to be formed by atomic layer deposition (ALD). ALD enables absorber elements to be formed as thin metal films with precise and uniform thickness. As a result, ALD thin film bolometers are orders of magnitude more sensitive than thermopile sensors. The use of ALD thin film technology has allowed bolometer fabrication to be implemented on top of a complementary metal-oxide-semiconductor CMOS. However, there is still a need for methods of fabricating bolometer sensors that more fully integrate the design and structure of the bolometer into the CMOS process.

DETAILED DESCRIPTION

Figure 1:
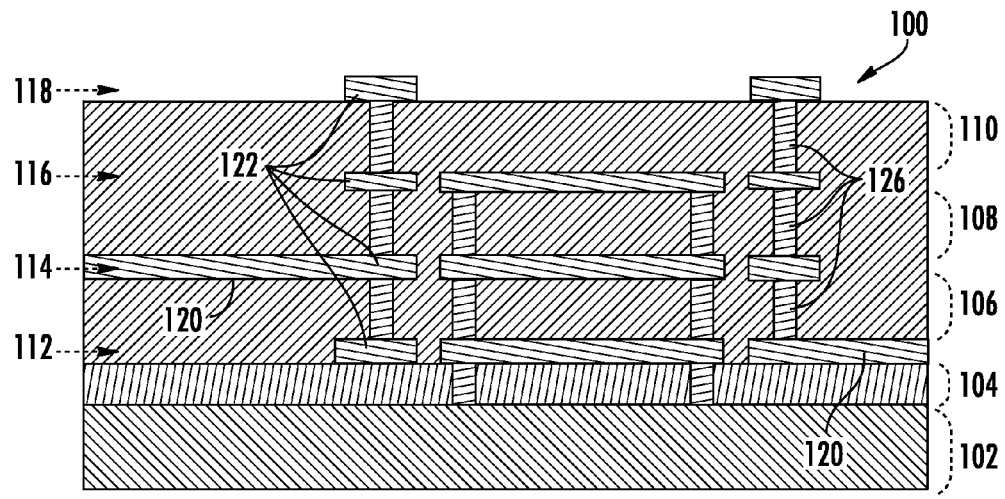
FIG. 1 is cross-sectional view of a CMOS substrate for implementing a bolometer sensor prior to the formation of the absorber layer for the bolometer.

For the purposes of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one of ordinary skill in the art to which this disclosure pertains.

Figure 19:
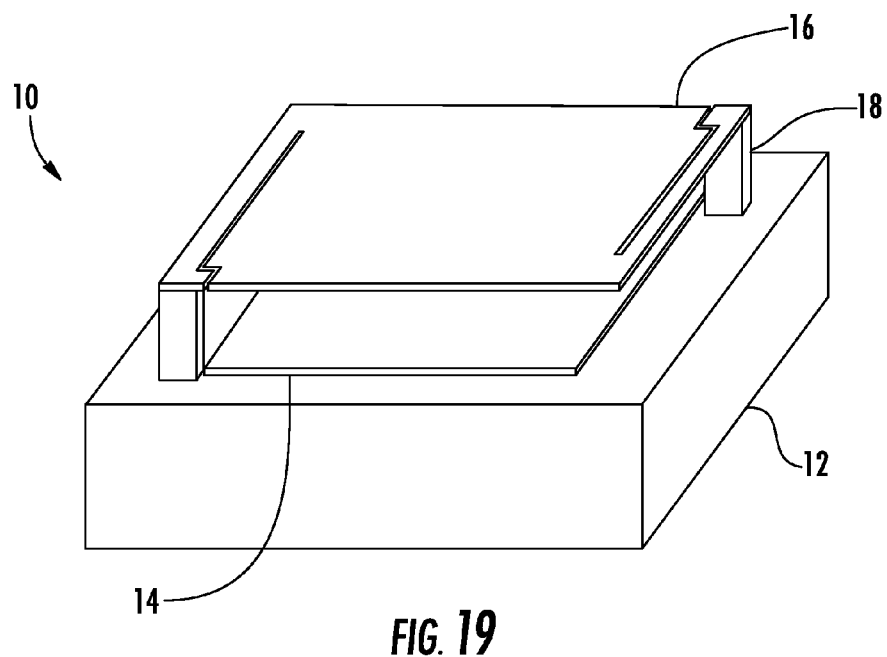
FIG. 19 is a perspective view of a bolometer sensor fabricated on top of a CMOS substrate.
Figure 20:
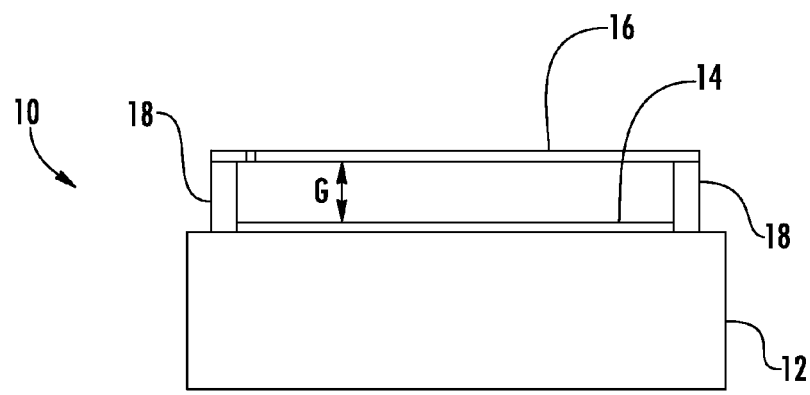
FIG. 20 is a side elevational view of the bolometer sensor of FIG. 19.

FIGS. 19 and 20 depict an embodiment of a bolometer sensor 10 implemented on top of a CMOS substrate 12. The sensor 10 includes the substrate 12, a reflector 14, and an absorber 16. Although a single sensor 10 is depicted in FIGS. 19 and 20, the substrate 12, which in this embodiment is a silicon wafer, may be fabricated with a plurality of bolometer sensors that form a microbolometer array (not shown) with each bolometer corresponding to a pixel of the array. The substrate 12 includes the electronic circuitry (not shown) used to access the output of the sensor 10. The reflector 14 may comprise, for example, a metallization layer or a multilayer dielectric formed on the substrate 12.

The absorber 16 is spaced apart from the reflector 14 by pillars 18. In this embodiment, the gap G between the reflector 14 and the absorber 16 is about 2.5 µm although any suitable gap width may be provided. The gap in this embodiment is selected to optimize absorption in the long-wavelength infrared region. The pillars 18, in addition to establishing the gap G between the absorber 16 and the reflector 14, are formed of an electrically conductive material and provide electrical contact with the read out circuitry (not shown) provided in the substrate 10.

The absorber 16, in addition to absorbing energy from incident photons, is selected to provide a good noise-equivalent temperature difference (NETD). In order for the absorber 16 to have a good NETD, the material selected to form the absorber 16 should exhibit a high temperature coefficient of resistance while exhibiting low excess noise (1/f noise, Johnson noise, . . . ). Semiconductor materials such as vanadium oxide are common in micromachined bolometers due to their high temperature coefficient of resistance. While metals have a lower temperature coefficient of resistance than some semiconductor materials, such as vanadium oxide, metals typically have much lower excess noise than many semiconductor materials.

Accordingly, in one embodiment the absorber 16 comprises metal. Titanium and Platinum are two metal which exhibit desired characteristics. Titanium, for example, exhibits a bulk resistivity of about $7*10^{-7}$ Ohm. Using a bulk resistivity of $7*10^{-7}$ Ohm, the thickness of the absorber 106 to match the impedance of free-space (377 Ohm/square) should be about 1.9 nm. The resistivity of materials formed to a thickness less than about 50 nm, however, can be several times higher than the bulk value. Accordingly, depending on process parameters, the thickness of the absorber 16, if made from titanium, is preferably about 10 nm. Impurities can also be introduced into the absorber 16 during formation in order to tune the resistivity if needed. Consequently, the thickness of the absorber 16 in this embodiment is about 10 nm and the length of the absorber 16 from pillar to pillar is about 25 µm. This configuration provides a ratio between the thickness of the absorber 16 and the length of the absorber 16 in the order of 1/1000 and the ratio of the thickness of the absorber 16 to the gap width G of about 1/100.

In operation, when electromagnetic radiation (e.g. infrared light) reaches the sensor 10, the electromagnetic radiation is absorbed within the thin-film metal of the absorber 16 with an efficiency depending on the resistivity of the absorber 16, quality of the reflector 14, gap width between the absorber 16 and the reflector 14, and radiation wavelength. Upon absorbing the incident radiation, the absorber 16 undergoes an increase in temperature. This temperature increase, in turn, leads to either a decrease or increase of the resistivity of the absorber 16. The absorber 16 is then electrically probed to measure the resistivity of, and thus indirectly measure the amount of incident electromagnetic radiation on, the absorber 16.

This disclosure is directed to methods of integrating the bolometer design and structure into the CMOS process. As discussed below, bolometer fabrication may be integrated into the CMOS process by utilizing CMOS layers for wiring, anchoring and reflecting. Incorporating CMOS layers into the structure of the bolometer can decrease the production cost for the device and allow for variations in the design that would otherwise be too complex or impractical to implement. In one embodiment, a method of manufacturing a bolometer sensor includes utilizing the oxide of the CMOS process as the sacrificial layer for the absorber. The method also includes the use of selective hydrofluoric acid vapor dry etch release process for removal of sacrificial layer and to prevent stiction of the fragile absorber layer. Integrating bolometer fabrication into the CMOS process enables various reflector gaps by using different metal layers of CMOS flow. CMOS integration also enables the reflector and/or the absorber layers of the bolometer to be patterned to improve absorption and increase mechanical stability.

Figure 2:
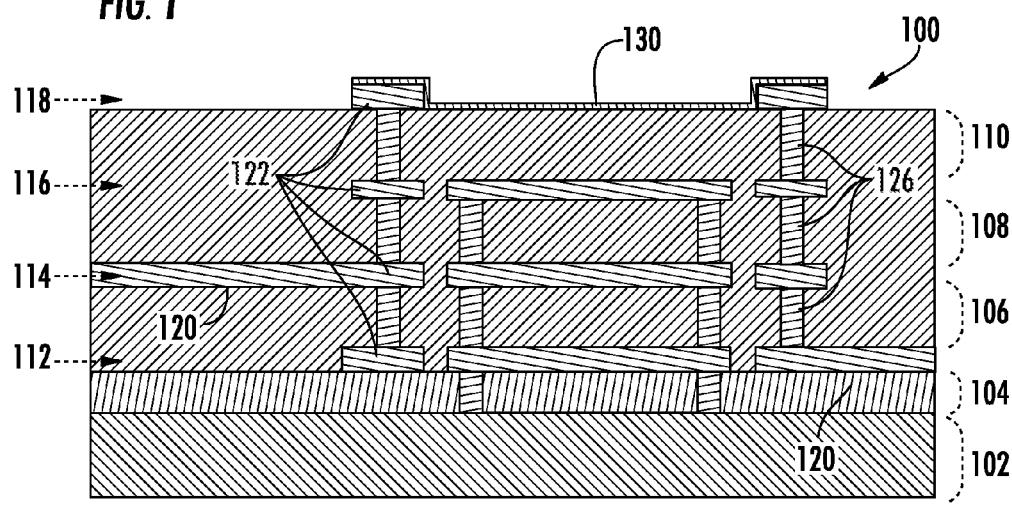
FIG. 2 is a cross-sectional view of the CMOS substrate of FIG. 1 after the formation of the absorber layer for the bolometer.
Figure 3:
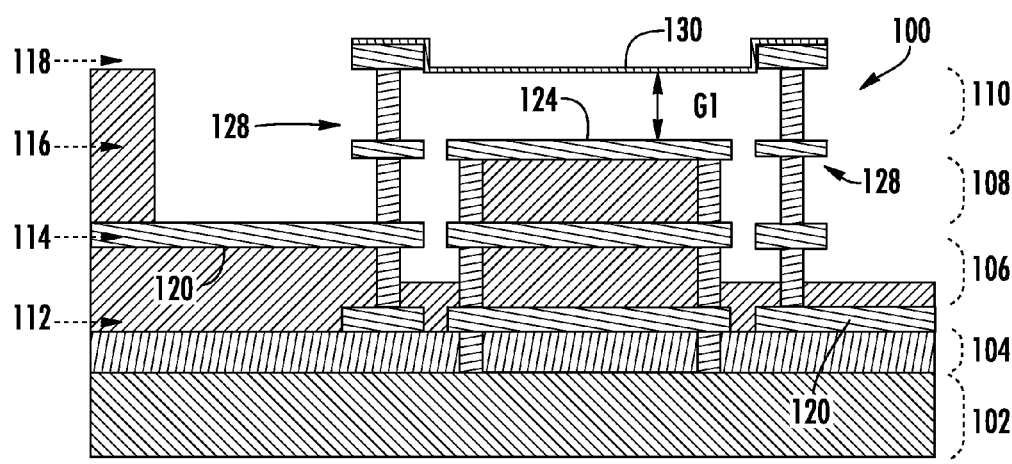
FIG. 3 is a cross-sectional view of the CMOS substrate of FIG. 2 after etching has been performed to release the absorber layer and expose a metallization layer in the CMOS substrate to serve as the reflector for the bolometer.

FIGS. 1-3 depict a cross-sectional view of a CMOS substrate 100 that incorporates structural features for implementing a bolometer sensor. The CMOS substrate 100 includes a base substrate layer 102, such as silicon, upon which a plurality of oxide layers 104, 106, 108, 110 and metallization layers 112, 114, 116, 118 have been formed. The metallization layers 112, 114, 116, 118 have been patterned to form conductors 120 and contact structures 122 for the bolometer sensor. The metallization layers 112, 114, 116, 118 have also been patterned to enable at least one of the metallization layers to be used as the reflector 124 for the bolometer. Vias 126 are provided in strategic locations in the CMOS substrate 100 for interconnecting contact structures 122. As discussed below, the vias 126 and contact structures 122 align to form pillars 128 that are configured to anchor the absorber layer 130 (FIG. 2) to the substrate 100 and to suspend the absorber layer 130 above the reflector 124. The pillars 128 may also be configured to suspend portions of a metallization layer to provide a patterned reflector for bolometer.

FIG. 1 shows the CMOS substrate for implementing a bolometer prior to the formation of the absorber layer 130 for the bolometer. FIG. 2 shows the CMOS substrate 100 after the absorber layer 130 has been formed on top of the oxide layer 110. In one embodiment, the absorber layer 130 is formed by atomic layer deposition (ALD). Due to the typical resistivity of deposited metals and semiconductors, the suspended thin-film is provided with a thickness that is less than 50 nm.

In the embodiment of FIGS. 1 and 2, the oxide layers of the CMOS substrate 100 are used as sacrificial layers for releasing the absorber 130 and exposing the reflector 124. FIG. 3 depicts the CMOS substrate 100 after the sacrificial oxide layers have been removed to release the absorber 130 and expose the reflector 124. As depicted in FIG. 3, oxide layer 110 has been completely removed. Oxide layer 108 has been partially removed leaving a portion of the oxide layer 108 as support for the reflector 124. Portions of the oxide layer 106 have also been removed to either side of the reflector region and to the right of the pillar 18 in FIG. 3. To prevent stiction of the absorber layer 130, a hydrofluoric acid vapor dry etch release process is performed to remove of sacrificial layers. The vias 126 and metallization contacts 122 are aligned to form pillars 128 that protrude from the substrate to suspend the absorber 130 above the reflector 124 to provide a gap G1. The metal conductor layers and the metal vias may also serve as intrinsic etch stop layers both horizontally and vertically. In alternative embodiments, the oxide can be removed by a combination of anisotropic reactive-ion etching (RIE) and isotropic vapor HF etching.

Figure 6:
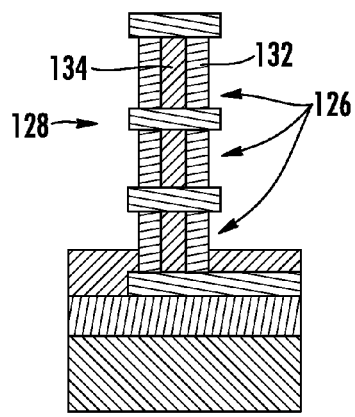
FIG. 6 is a cross-sectional view of an embodiment of anchor for supporting the absorber of the bolometer of FIGS. 1-5.
Figure 7:
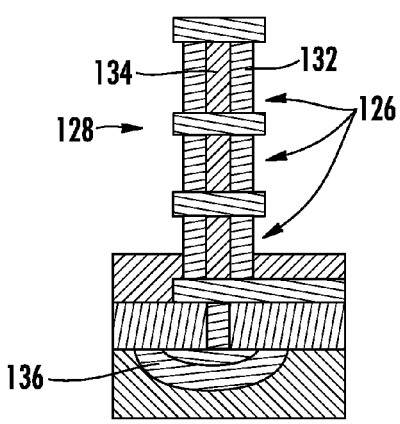
FIG. 7 is a cross-sectional view of the anchor of FIG. 6 showing the electrical connection between the anchor and the wiring to the ASIC part of the CMOS. The Anchor is here mechanically connected to the substrate and electrically insulated via one or multiple diffusions 136.
Figure 8:
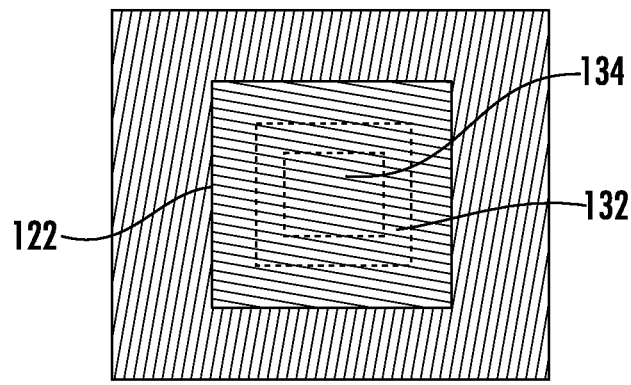
FIG. 8 is a top view of the anchor of FIG. 6 with the inter-metal via shown in dotted lines.
Figure 9:
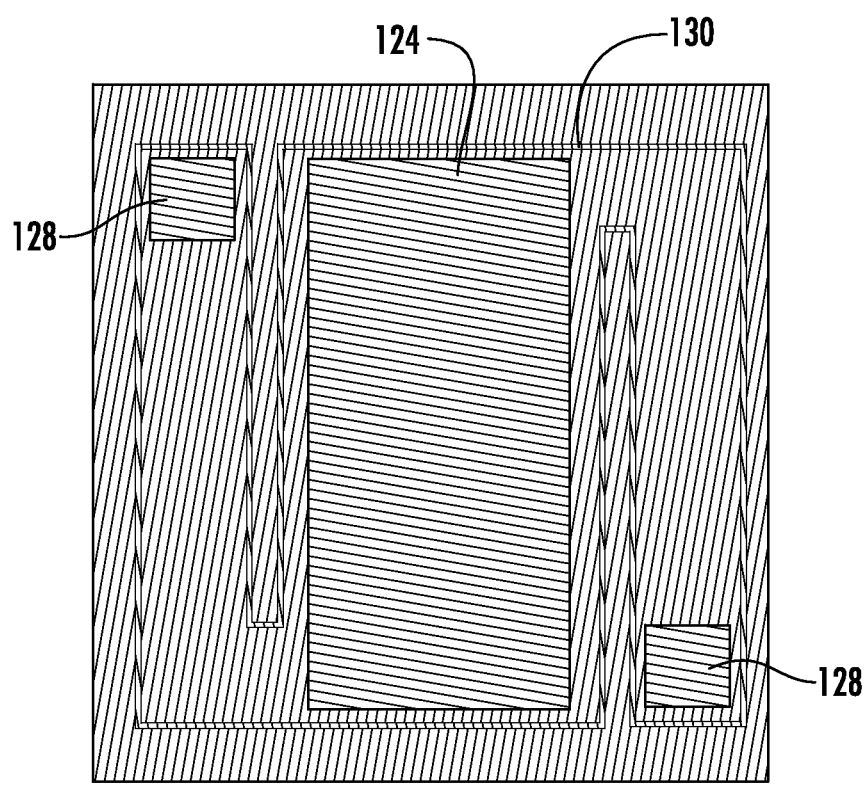
FIG. 9 is a top schematic view of the absorber of the bolometer.

In one embodiment, the vias 126 include an outer layer 132 formed of a conductive material that surrounds an inner oxide layer 134 as depicted in FIGS. 6-8. The inner oxide layer 134 of the vias 126 is protected by the conductive layer 132 so it is not removed with the sacrificial layers during the etching process. In one embodiment, the pillars 128 may be mechanically coupled using one or more doping steps electrically insulated from the substrate. In another embodiment, the pillars 128 may be electrically connected to the substrate by implant regions 136 formed in the substrate 100 at the base of the pillars 128 as depicted in FIG. 7. FIG. 9 shows the positioning of the absorber 130 over the pillars 128 and reflector 124. The absorber 130 can be realized in various types/geometries including serpentine, rectangular, textured, perforated, and the like.

Figure 4:
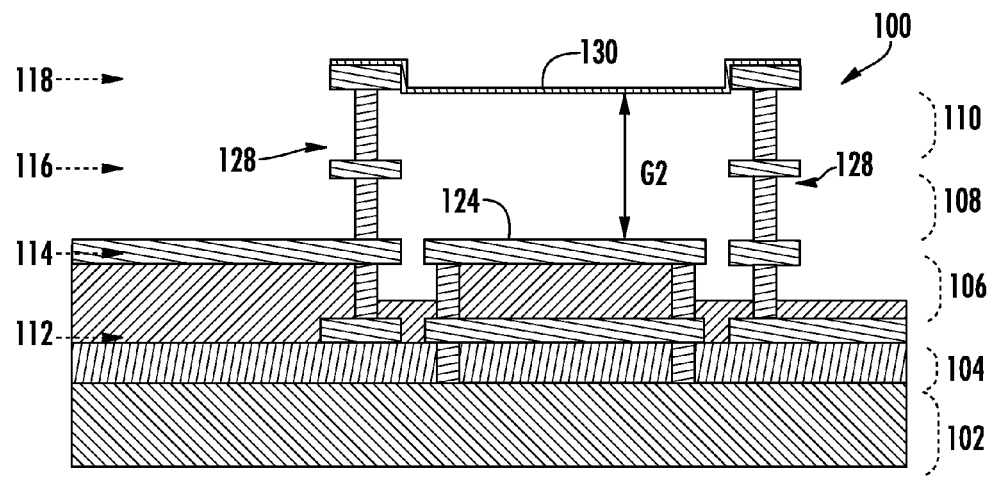
FIGS. 4 and 5 show alternative embodiments of the bolometer of FIG. 3 in which different metallization layers are exposed to serve as the reflector.
Figure 5:
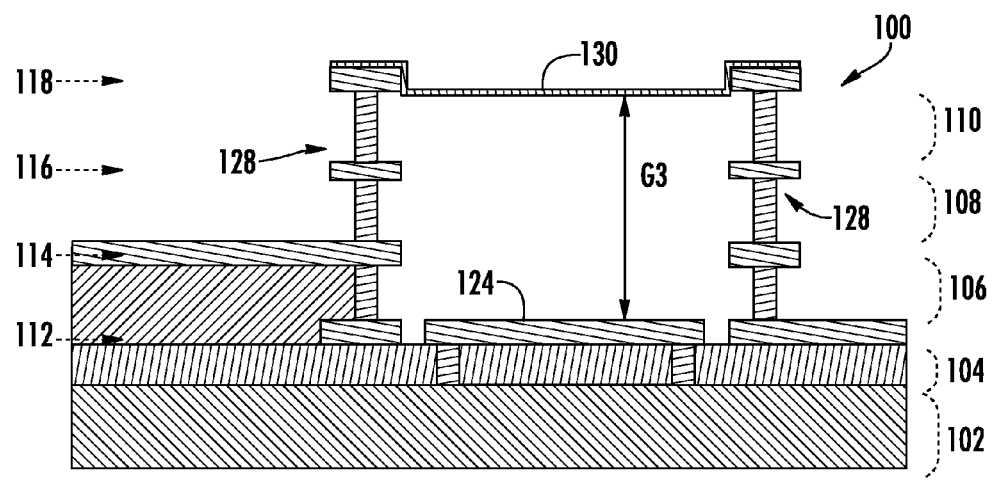

In the embodiment of FIG. 3, the metallization layer 116 is selected to serve as the reflector 124 for the bolometer. The metallization layer 116 defines a gap width G1 between the absorber 130 and reflector 124 of the bolometer. FIGS. 4 and 5 depict alternative embodiments of bolometer implementations in which different metallization layers on the CMOS substrate are selected to serve as the reflector for the bolometer. In the embodiment of FIG. 4, the metallization layer 114 is used to form the reflector 124 for the bolometer which defines a gap width G2 between the absorber 130 and reflector 124 that is greater than G1. In the embodiment of FIG. 5, the metallization layer 112 is used to form the reflector which defines a gap width G3 that is greater than G1 and G2.

Figure 10:
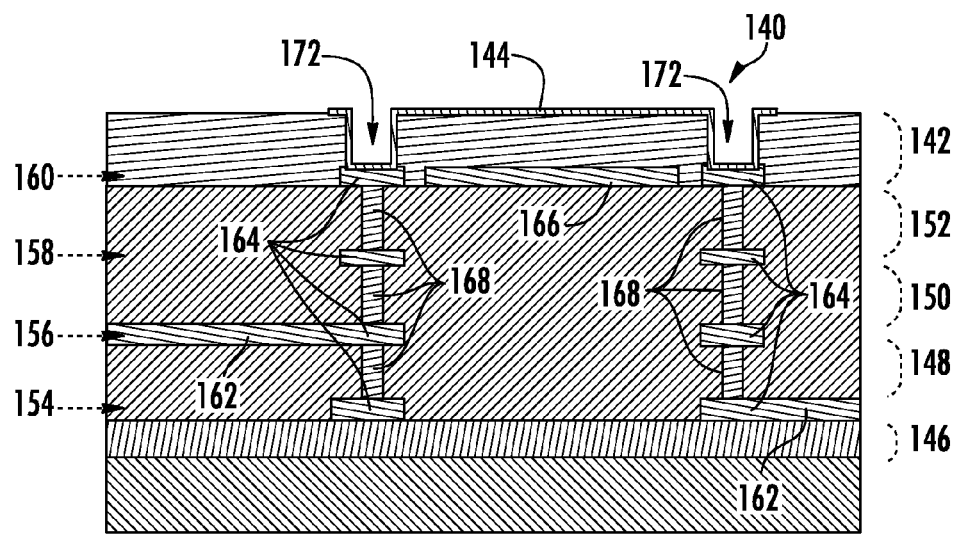
FIG. 10 is cross-sectional an alternative CMOS substrate for implementing a bolometer showing a polymer sacrificial layer formed on top of the oxide on the substrate and the absorber for the bolometer formed over the sacrificial layer.
Figure 11:
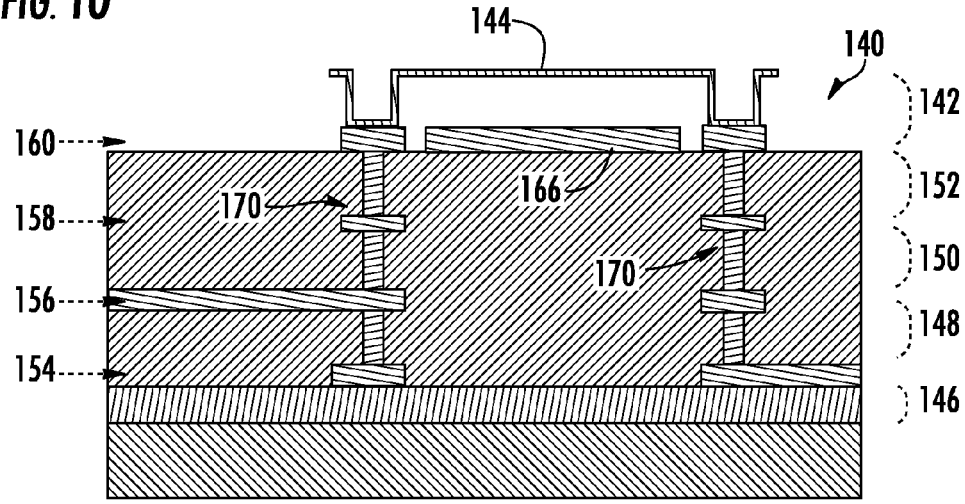
FIG. 11 shows the CMOS substrate of FIG. 10 after the sacrificial layer has been removed.

FIGS. 10 and 11 depict an alternative embodiment of bolometer implementation that includes the formation of a polymer layer 142 on a CMOS substrate 140 to serve as a sacrificial layer for releasing the absorber 144. The CMOS substrate includes a plurality of oxide layers 146, 148, 150, 152 and metallization layers 154, 156, 158, 160. The metallization layers 154, 156, 158, 160 have been patterned to form conductors 162 and contact structures 164 for the bolometer sensor. In this embodiment, the metallization layer 160 has been patterned to form the reflector 166. Vias 168 are provided to electrically connect the contact structures. The vias 168 and contact structures 164 are aligned to form anchors 170 that connect the absorber to the substrate.

Figure 12:
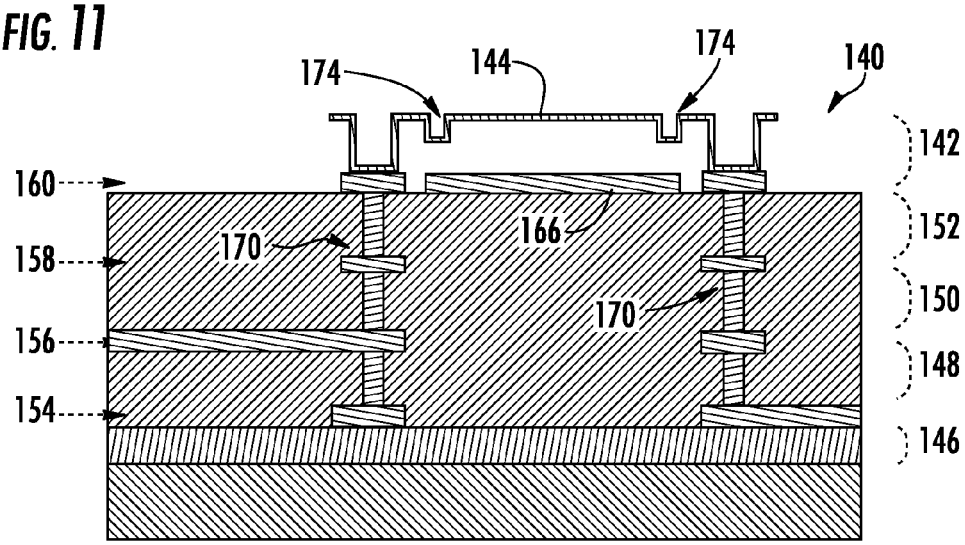
FIG. 12 shows an alternative embodiment of the absorber of FIG. 11 with additional patterning of bolometer cross-section for increased mechanical stability.

The absorber 144 is formed on the polymer layer 142. The polymer sacrificial layer 142 is removed, e.g. using an $O_2$ plasma etching process, to release the absorber 144 and expose the reflector 166. In this embodiment, trenches 172 are provided in the polymer layer 142 that extend through the polymer layer 142 to the metal contacts 164 in the metallization layer 160 to allow the absorber layer 144 to make contact with the anchors. As depicted in FIG. 11, once the polymer layer is removed, the geometry of the absorber defined by the trenches 172 allows the absorber layer to be suspended above the reflector 166 to form a gap with a width that corresponds to the thickness of the polymer layer 142. Trenches may also be provided in the polymer layer to pattern the absorber to increase mechanical stability. For example, FIG. 12 depicts an alternative embodiment of the absorber of FIGS. 10 and 11 that includes U-shaped structural features 174 formed by additional trenches (not shown) provided in the polymer layer.

Figure 13:
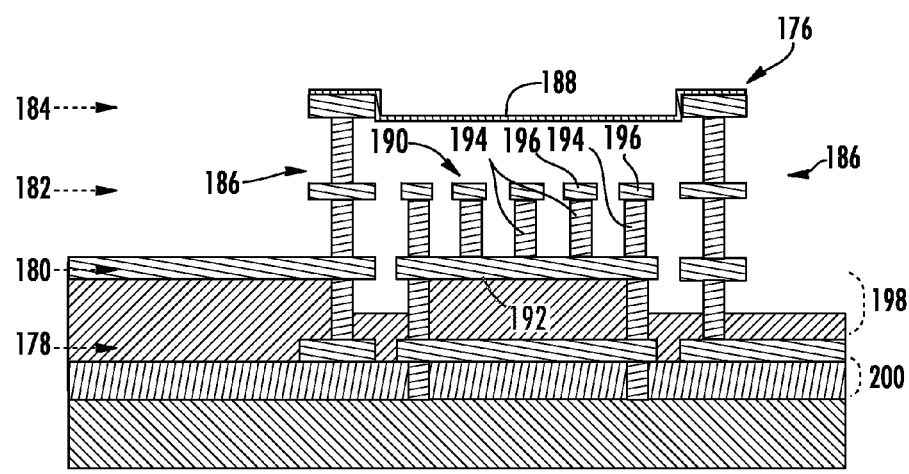
FIGS. 13 and 14 show alternative embodiments of bolometers that include patterned reflectors formed by different metallization layers and vias in the CMOS substrate.
Figure 14:
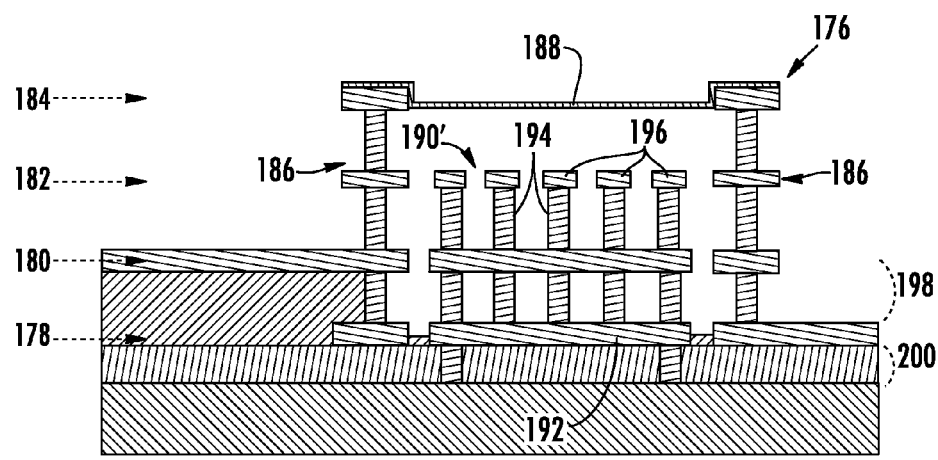

FIGS. 13 and 14 show examples of bolometers that include patterned reflectors formed by different metallization layers and vias in the CMOS substrate to adjust the reflecting characteristics of the reflector. In FIG. 13, the CMOS substrate 176 includes metallization layers 178, 180, 182, 184 that have been patterned to form pillars 186 that suspend the absorber 188 above a patterned reflector 190. The base 192 of the patterned reflector 190 is formed by metallization layer 180 that is supported by a remaining portion of an oxide layer 198 on the substrate. The patterned reflector 190 includes vias/pillars 194 that suspend portions 196 of the metallization layer 182 above the base reflector 192. In the exemplary embodiment of FIG. 13, the patterned reflector 190 is formed by two metallization layers 180, 182 and one inter-metal via 194. FIG. 14 depicts an alternative exemplary embodiment of the substrate 176 of FIG. 13 that includes a patterned reflector 190' formed by three metallization layers and two inter-metal vias. In FIG. 14, the base 192 of the reflector 190' is formed by metallization layer 178 which is supported by oxide layer 200. Pillars 194 are formed above the base 192 by two metallization layers 180, 182 and two inter-metal vias. Oxide layer 198 has been completely removed from the areas between the pillars 194.

Figure 15:
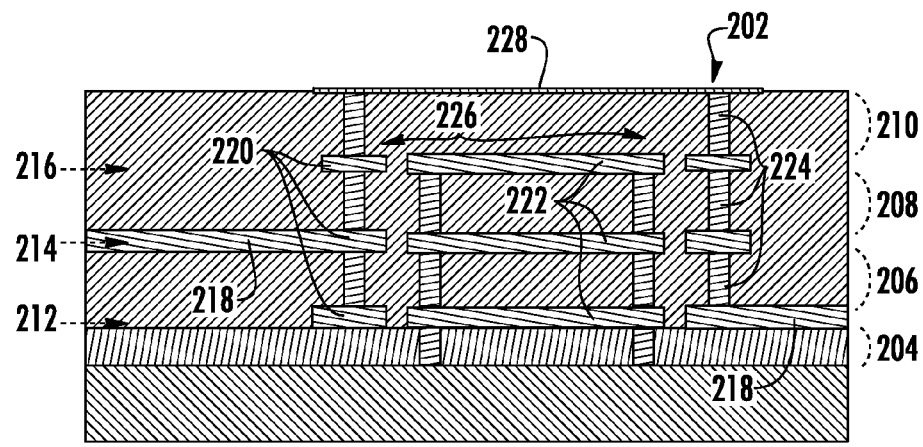
FIG. 15 shows a CMOS substrate for implementing a bolometer showing the absorber layer of the bolometer electrically connected to the vias prior to removal of the oxide.
Figure 16:
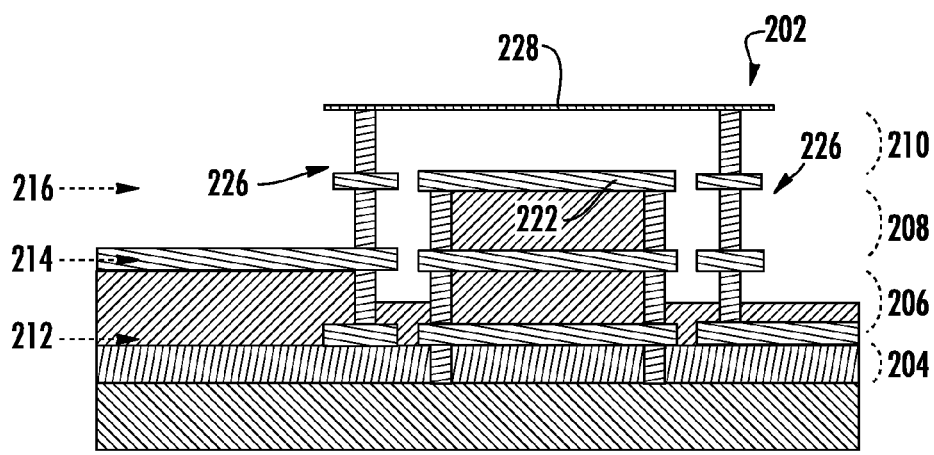
FIG. 16 shows the CMOS substrate of FIG. 15 after removal of the oxide to form the bolometer.

FIGS. 15 and 16 depict an embodiment of a bolometer in which the absorber layer of the bolometer is electrically connected to the vias rather than to a metallization layer contact. As depicted in FIG. 15, CMOS substrate 202 includes oxide layers 204, 206, 208, 210 and metallization layers 212, 214, 216. The metallization layers 212, 214, 216 are patterned to form conductors 218 and contacts 220 as well as potential reflectors 222. Vias 224 are provided to electrically connect the contacts 220 and form pillars 226. An absorber layer 228 is formed on the oxide layer 210 that is electrically connected to the vias 224 in the oxide layer 210 so a top metallization layer does not have to be provided on the surface of the uppermost oxide layer 210.

FIG. 16 shows the substrate 202 of FIG. 15 after the sacrificial oxide, i.e., oxide layers 208, 210, and portions of layer 206, has been removed using a hydrofluoric acid vapor dry etch process. In this embodiment, the metallization layer 216 is used to form the reflector 222. In alternative embodiments, the reflector 22 could also be formed by metallization layer 214 or metallization layer 212.

Figure 17:
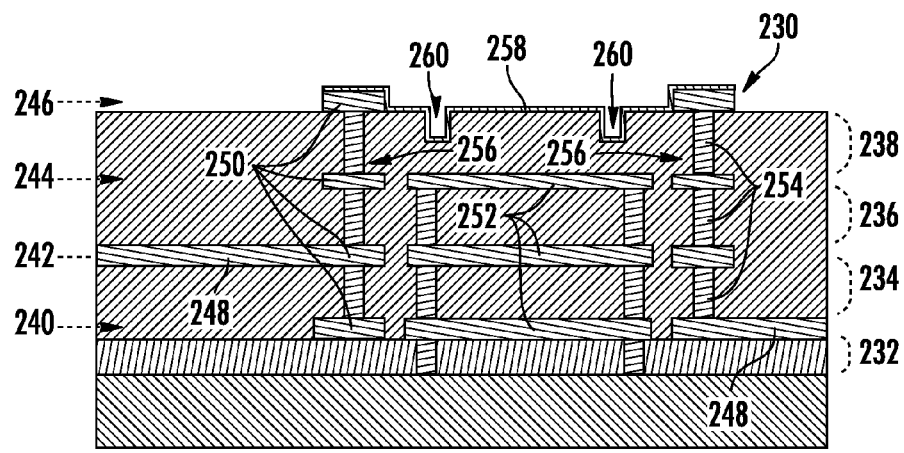
FIG. 17 shows a CMOS substrate with oxide trenches for patterning the absorber for increased mechanical stability.
Figure 18:
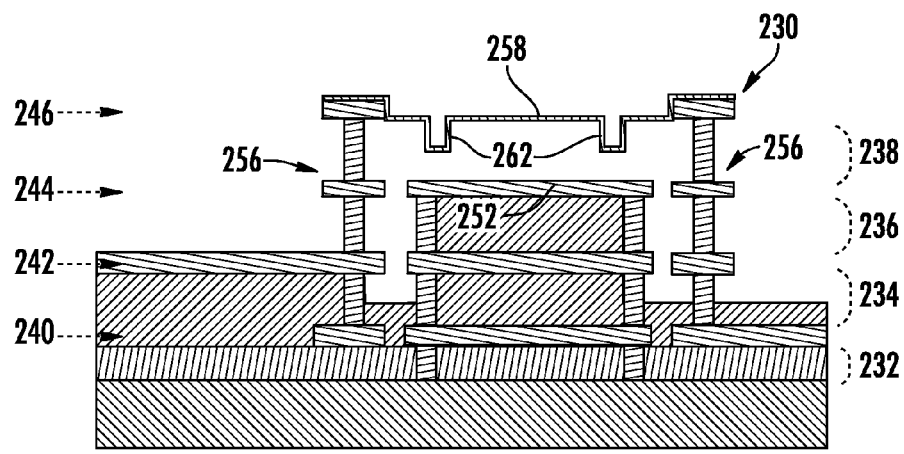
FIG. 18 shows the CMOS substrate of FIG. 17 after the oxide has been removed to form the bolometer.

FIGS. 17 and 18 depict an embodiment of a bolometer in which trenches are provided in the oxide of the CMOS substrate to pattern the absorber layer of the bolometer similar to the embodiment of FIG. 12. As depicted in FIG. 17, CMOS substrate 230 includes oxide layer 232, 234, 236, 238 and metallization layers 240, 242, 244, 246. The metallization layers are patterned to form conductors 248, contacts 250, and potential reflectors 252. Vias 254 are provided to electrically connect the contacts and form pillars 256. An absorber layer 258 is formed on the oxide layer 238. Trenches 260 are provided in the oxide layer 238 to add structural features to the absorber for enhancing performance or increasing structural stability.

In the embodiment of FIGS. 17 and 18, two trenches 260 are provided that are configured to form U-shaped grooves or beams 262 in the absorber 258. In alternative embodiments, more or fewer trenches may be used with different shapes for imparting different structural features to the absorber. In some embodiments, additional material may be added on top of the oxide layer 238, such as pads or bumps (not shown), to add structural elements to the absorber that extend upwardly from the oxide layer 238.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of manufacturing a semiconductor device comprising:
   depositing a plurality of reflector metallization layers and a plurality of oxide layers in an alternating pattern over a reflector region of a substrate during a complementary metal-oxide-semiconductor (CMOS) process such that each of the reflector metallization layers extend over the reflector region at a different level above the reflector region, the reflector metallization layers being patterned to form contact structures, the contact structures at the different levels being aligned vertically with respect to each other;
   forming vias that extend through the oxide layers and electrically connect the contact structures to form pillar structures;
   depositing an absorber layer on top of the plurality of reflector metallization layers, the plurality of oxide layers and the pillar structures such that the absorber layer is electrically connected to the pillar structures; and
   after depositing the absorber layer, removing portions of the oxide layers beneath the absorber layer and around the pillar structures down to a topmost reflector metallization layer of the plurality of the reflector metallization layers to form a gap over which a portion of the absorber layer is suspended by the pillar structures, the topmost reflector metallization layer being exposed in the gap,
   wherein depositing the plurality of reflector metallization layers and the plurality of oxide layers further comprises:
   depositing a first oxide layer of the plurality of oxide layers on the substrate;
   depositing a first reflector metallization layer of the plurality of reflector metallization layers on top of the first oxide layer;
   forming a second oxide layer of the plurality of oxide layers on top of the first reflector metallization layer;
   forming second vias in the second oxide layer that extend down to the first reflector metallization layer;
   depositing a second reflector metallization layer of the plurality of reflector metallization layers on top of the second oxide layer and the second vias;
   patterning the second reflector metallization layer by removing portions of the second reflector metallization layer around the second vias;
   forming a third oxide layer of the plurality of oxide layers on top of the second reflector metallization layer;
   depositing the absorber layer on top of the third oxide layer;
   removing a portion of the third oxide layer beneath the absorber layer down to the second reflector metallization layer and portions of the second oxide layer between the second vias down to the first reflector metallization layer to form the gap with the portion of the absorber layer suspended over the qap and the first and second reflector metallization layers exposed below the absorber layer to form a patterned reflector structure,
   wherein the pillar structures include the vias and the second vias,
   wherein the removal of the portion of the third oxide layer and the portions of the second oxide layer is carried out such that the first oxide layer is not exposed in the gap between the pillar structures.

2. The method of claim 1, further comprising:
   patterning the topmost reflector metallization layer to serve as a reflector for the absorber layer.

3. The method of claim 1, further comprising:
   depositing a third reflector metallization layer of the plurality of reflector metallization layers on top of the third oxide layer;
   forming third vias in the third oxide layer that extend down to the second reflector metallization layer and are aligned with the second vias in the second oxide layer;
   patterning the third reflector metallization layer by removing portions of the third reflector metallization layer around the third vias in the third oxide layer;
   forming a fourth oxide layer of the plurality of oxide layers on top of the third reflector metallization layer;
   depositing the absorber layer on top of the fourth oxide layer; and
   removing a portion of the fourth oxide layer beneath the absorber layer down to the third reflector metallization layer, portions of the third oxide layer between the third vias down to the second reflector metallization layer, and portions of the second oxide layer between the second vias down to the first reflector metallization layer to form the gap with the portion of the absorber layer suspended over the gap and the first, second, and third reflector metallization layers exposed below the absorber layer to form the patterned reflector structure;
   wherein the pillar structures include the vias, the second vias, and the third vias.

4. The method of claim 1, further comprising:
   forming U-shaped trenches in the portions of the oxide layers for defining U-shaped beams in the absorber layer;
   depositing the absorber layer on top of the portions of the oxide layers and in the U-shaped trenches; and
   removing the portions of the oxide layers including the U-shaped trenches beneath the absorber layer to form the gap with the portion of the absorber layer including the U-shaped beams defined by the U-shaped trenches suspended over the gap.

5. The method of claim 1, wherein the portions of the oxide layers are removed to form the gap using a selective hydrofluoric acid vapor dry etch release process.

6. The method of claim 1, wherein the absorber layer is deposited using an atomic layer deposition process.

7. The method of claim 6, wherein the absorber layer is deposited at a thickness of approximately 50 nm or less.

8. The method of claim 7, wherein the absorber layer is formed of metal.

9. The method of claim 8, wherein the absorber layer includes at least one of titanium and platinum.

* * * * *